(12) United States Patent
Woods et al.

(10) Patent No.: US 11,932,940 B2
(45) Date of Patent: Mar. 19, 2024

(54) SILYL PSEUDOHALIDES FOR SILICON CONTAINING FILMS

(71) Applicant: Applied Materials, Inc., Santa Clara, CA (US)

(72) Inventors: Keenan N. Woods, San Ramon, CA (US); Cong Trinh, Santa Clara, CA (US); Mark Saly, Santa Clara, CA (US); Mihaela A. Balseanu, Sunnyvale, CA (US); Maribel Maldonado-Garcia, San Jose, CA (US); Lisa J. Enman, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 123 days.

(21) Appl. No.: 17/096,341

(22) Filed: Nov. 12, 2020

(65) Prior Publication Data

US 2021/0140046 A1 May 13, 2021

Related U.S. Application Data

(60) Provisional application No. 62/934,509, filed on Nov. 12, 2019.

(51) Int. Cl.
| | | |
|---|---|---|
| C23C 16/34 | (2006.01) | |
| C08K 5/5475 | (2006.01) | |
| C23C 16/40 | (2006.01) | |
| C23C 16/455 | (2006.01) | |
| H01L 21/02 | (2006.01) | |
| H01L 21/768 | (2006.01) | |

(52) U.S. Cl.
CPC ...... C23C 16/45553 (2013.01); C08K 5/5475 (2013.01); C23C 16/345 (2013.01); C23C 16/401 (2013.01); C23C 16/45536 (2013.01); H01L 21/02126 (2013.01); H01L 21/76826 (2013.01)

(58) Field of Classification Search
None
See application file for complete search history.

(56) References Cited

U.S. PATENT DOCUMENTS

| | | | | |
|---|---|---|---|---|
| 5,244,698 A | * | 9/1993 | Ishihara | C23C 16/24 427/255.393 |
| 2003/0138562 A1 | | 7/2003 | Subramony et al. | |
| 2008/0283972 A1 | * | 11/2008 | Muh | H01L 21/02216 257/E21.279 |
| 2010/0041243 A1 | | 2/2010 | Cheng et al. | |
| 2010/0055442 A1 | * | 3/2010 | Kellock | H01L 21/022 428/319.1 |
| 2013/0071580 A1 | * | 3/2013 | Weidman | C23C 16/505 427/535 |
| 2015/0287593 A1 | * | 10/2015 | Canaperi | H01L 21/02126 257/773 |
| 2016/0208386 A1 | | 7/2016 | Bonrad et al. | |
| 2018/0197735 A1 | * | 7/2018 | Quick | H01L 21/76831 |
| 2018/0330980 A1 | * | 11/2018 | Liang | C23C 16/308 |
| 2020/0286725 A1 | * | 9/2020 | Sharma | C23C 16/36 |

FOREIGN PATENT DOCUMENTS

| | | | | | |
|---|---|---|---|---|---|
| JP | 11111714 A | * | 4/1999 | | C23C 16/045 |
| WO | WO-2011043139 A1 | * | 4/2011 | | C23C 16/401 |
| WO | WO-2018077684 A1 | * | 5/2018 | | C23C 16/325 |
| WO | WO-2018204709 A1 | * | 11/2018 | | C23C 16/045 |

OTHER PUBLICATIONS

PCT International Search Report and Written Opinion in PCT/US2020/060127 dated Mar. 9, 2021, 11 pages.

* cited by examiner

*Primary Examiner* — Jose I Hernandez-Kenney

(74) *Attorney, Agent, or Firm* — Servilla Whitney LLC

(57) ABSTRACT

Silyl pseudohalides having a general formula of $R_{4-n}SiX_n$, where n is a range of 1-4, each R is independently selected from H, alkyl, alkenyl, aryl, amino, alkyl amino, alkoxide, and phosphine groups, and each X is a pseudohalide selected from nitrile, cyanate, isocyanate, thiocyanate, isothiocyanate, selenocyanate and isoselenocyanate are disclosed. Further, some embodiments of the disclosure provide methods for depositing silicon-containing films using silyl pseudohalides.

17 Claims, No Drawings

SILYL PSEUDOHALIDES FOR SILICON CONTAINING FILMS

CROSS-REFERENCE TO RELATED APPLICATIONS

This application claims priority to U.S. Provisional Application No. 62/934,509, filed Nov. 12, 2019, the entire disclosure of which is hereby incorporated by reference herein.

TECHNICAL FIELD

Embodiments of the present disclosure generally relate to silyl pseudohalides and methods of use to deposit silicon containing films.

BACKGROUND

Silicon-based materials are the basis of the semiconductor industry, and silyl halides are a common precursor for silicon-containing thin films. However, silyl halides and their reaction byproducts can etch substrates or other device components, making them non-viable for a variety of applications.

Accordingly, there is a need for silicon deposition precursors with similar reactivity to silyl halides without the risk for etching or otherwise damaging underlying substrate materials and components.

SUMMARY

One or more embodiments of the disclosure are directed to a method of depositing a SiO-containing film. The method comprises exposing a substrate to a silyl pseudohalide and an oxidizing agent to deposit the SiO-containing film, provided that the silyl pseudohalide is not $Si(NCO)_4$ or $CH_3OSi(NCO)_3$.

Additional embodiments of the disclosure are directed to a method of depositing a SiN-containing film. The method comprises exposing a substrate to a silyl pseudohalide and a nitridating agent to deposit the SiN-containing film.

Further embodiments of the disclosure are directed to a method of depositing a SiCON-containing film. The method comprises exposing a substrate to a silyl pseudohalide and a reactant to deposit the SiCON-containing film.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, metal silicides and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to silyl pseudohalides and uses thereof for the deposition of silicon containing films. Some embodiments of the disclosure relate to silyl psedohalides. Some embodiments of the disclosure relate to methods for depositing silicon-containing films, including but not limited to SiO-containing, SiN-containing and SiCON-containing films.

As used in this regard, "Si-containing films" is an open ended term to denote films which comprise silicon. A Si-containing film may also contain one or more other elements, including but not limited to oxygen, nitrogen and carbon. Similarly, a SiO-containing film comprises silicon and oxygen, and may also contain nitrogen and/or carbon.

Some embodiments of the disclosure provide for the use of silyl pseudohalides in place of silyl halides for the deposition of similar materials. The inventors have found that pseudohalogen functional groups have similar reactivity and are good/stable leaving groups. The pseudohalogen functional groups are also less corrosive/oxidizing. A non-exhaustive list of pseudohalogen leaving groups and the oxidizing power thereof is provided below:

$F^- > Cl^- > Br^- > CN^- > SCN^- > I^- > (SCSN_3)^- > SeCN^-$

Some embodiments of this disclosure relate to novel silyl pseudohalides. In some embodiments, the silyl pseudohalide has a general formula of $R_{4-n}SiX_n$, where n is 1-4, each R is independently selected from H, alkyl, alkenyl, aryl, amino, alkylamino, alkoxide, and phosphine groups, and each X is a pseudohalide selected from nitrile (—CN), cyanate (—OCN), isocyanate (—NCO), thiocyanate (—SCN), isothiocyanate (—NCS), selenocyanate (—SeCN) and isoselenocyanate (—NCSe). For the avoidance of doubt, the atom closest to the dash (—) is the atom bonded to the silicon atom.

As used in this disclosure and the appended claims, the following terms are provided with the definitions outlined below. Alkyl is any saturated carbon chain containing 1-6 carbon atoms. In some embodiments, an alkyl group may be branched or linear. In some embodiments, an alkyl group may be cyclic.

Alkenyl is an unsaturated carbon chain containing 2-6 carbon atoms. In some embodiments, an alkenyl group may be branched or linear. In some embodiments, an alkenyl group may contain a double bond. In some embodiments, an alkenyl group may be cyclic.

Aryl is any aromatic cyclic structure. In some embodiments, an aryl group may contain 4-8 atoms. In some embodiments, an aryl group may contain heteroatoms (e.g., N or O).

Amino is group with a nitrogen atom and associated hydrogen atoms bonded to the silicon atom.

Alkylamino is a group with at least one alkyl group (as defined above) bonded to a nitrogen atom which is bonded to the silicon atom.

Alkoxide is a group with an alkyl group (as defined above) bonded to an oxygen atom which is bonded to the silicon atom.

Phosphine is a group with a phosphorous atom and associated hydrogen atoms bonded to the silicon atom.

In some embodiments, the silyl pseudohalide comprises at least one R. Stated differently, in some embodiments, n is 1-3. In some embodiments, the silyl pseudo halide is not $Si(NCO)_4$. In some embodiments, when R is hydrogen, methyl, ethyl or methoxy, X is not —NCO for any n. In some embodiments, the silyl pseudohalide is not $(C_4H_9)Si(NCO)_3$. In some embodiments, when R is hydrogen, alkyl or aryl, X is not —NCSe when n is 1. In some embodiments, the silyl pseudo halide is not $Si(NCS)_4$. In some embodiments, when R is methyl, X is not —NCS for any n. In some embodiments, when R is alkyl, alkoxy or aryl, X is not —NCS when n is 1. In some embodiments, when $R_3$ consists of $(CH_3)H_2$, X is not —CN, —NCO, —NCS or —NCSe.

Some embodiments of this disclosure relate to methods for depositing silicon-containing films using the silyl pseudohalides disclosed above. The method of depositing a silicon-containing film comprises exposing a substrate to a silyl pseudohalide and a reagent to deposit a silicon-containing film.

In some embodiments, the exposing the substrate to the silyl pseudohalide and exposing the substrate to the reagent is performed simultaneously. Stated differently, in some embodiments, the silicon-containing film is deposit by a chemical vapor deposition (CVD) type method.

In some embodiments, the exposing the substrate to the silyl pseudohalide and exposing the substrate to the reagent is performed separately. Stated differently, in some embodiments, the silicon-containing film is deposit by an atomic layer deposition (ALD) type method. In some embodiments, the exposures may be separated by time in a time-domain ALD type method. In some embodiments, the exposures may be spatially separated by a physical partition or gas curtain. These embodiments may be known as a spatial ALD type method.

In some embodiments, the silyl pseudohalide does not contain 4 pseudohalide groups. Stated differently, in some embodiments, n is 1-3 or when n is 1-4, n is not 4.

In some embodiments, the silicon-containing film is a SiO-containing film and the reagent comprises one or more of oxygen gas ($O_2$), ozone ($O_3$), water ($H_2O$), alcohols (e.g., methanol, ethanol, isopropyl alcohol, t-butanol), peroxide ($H_2O_2$) or plasmas thereof. In some embodiments, the reagent may be referred to as an oxidizing agent. In some embodiments, the silyl pseudohalide is not $Si(NCO)_4$. In some embodiments, the silyl pseuohalide is not $CH_3OSi(NCO)_3$.

In some embodiments, the silicon-containing film is a SiN-containing film and the reagent comprises one or more of amines, alkylamines, hydrazine ($N_2H_4$), alkylhydrazines, allylhydrazines and plasmas thereof. In some embodiments, the reagent further comprises a plasma of He, $NH_3$, $N_2$, Ar, $H_2$ or a combination thereof. In some embodiments, the reagent is referred to as a nitridating agent.

In some embodiments, the silicon-containing film is a SiCON-containing film and the reagent comprises one or more of alcohols, peroxide, amines, alkyl amines, hydrazine, alkylhydrazines, allylhydrazines and plasmas thereof. In some embodiments, the reagent further comprises a plasma of CO, $O_2$, $N_2O$, He, $NH_3$, $N_2$, Ar, $H_2$ or a combination thereof. In some embodiments, the reagent may be referred to as a reactant.

Some embodiments of the disclosure relate to methods for depositing a SiON film. The method comprises exposing a substrate to a silyl pseudohalide in a processing chamber, purging the processing chamber, exposing the substrate to a plasma of $N_2$ or $NH_3$, and purging the processing chamber.

In some embodiments, the silyl pseudohalide is $Si(NCO)_4$. In some embodiments, the substrate is exposed to a pulse of ammonia and a purge of the processing chamber before exposure to a $N_2$ plasma.

In some embodiments, the atomic percentage of oxygen in the deposited film is higher than a SiON film deposited by a similar process using $SiH_2I_2$. In some embodiments, the deposited film has an oxygen content greater than or equal to about 5 atomic percent, greater than or equal to about 8 atomic percent, greater than or equal to about 10 atomic percent, greater than or equal to about 15 atomic percent, greater than or equal to about 20 atomic percent or greater than or equal to about 25 atomic percent.

In some embodiments, the atomic percentage of nitrogen in the deposited film is higher than a SiON film deposited by a similar process using $SiH_2I_2$. In some embodiments, the deposited film has an oxygen content less than or equal to about 50 atomic percent, than or equal to about 45 atomic percent, than or equal to about 40 atomic percent, or than or equal to about 35 atomic percent.

In some embodiments, the etch rate of the deposited film is higher than a SiON film deposited by a similar process using $SiH_2I_2$ or $SiI_4$. In some embodiments, the deposited film has an etch rate in 100:1 DHF which is greater than or equal to about 10 Å/min, greater than or equal to about 15 Å/min, greater than or equal to about 20 Å/min, greater than or equal to about 30 Å/min, greater than or equal to about 40 Å/min, greater than or equal to about 50 Å/min, greater than or equal to about 60 Å/min, greater than or equal to about 70 Å/min, greater than or equal to about 80 Å/min, or greater than or equal to about 90 Å/min.

In some embodiments, the etch rate of the deposited film is greater than a SiON film deposited by a similar process using $SiH_2I_2$ by a factor of greater than or equal to 3, greater than or equal to 5, greater than or equal to 8, greater than or equal to 10, greater than or equal to 12, or greater than or equal to 15.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a silicon-containing film, the method comprising exposing a substrate to a silyl pseudohalide and a reagent to deposit the silicon-containing film, the silyl pseudohalide has a general formula of $R_{4-n}SiX_n$, wherein n is 1-4, each R is independently selected from H, alkyl, alkenyl, aryl, amino, alkylamino, alkoxide, and phosphine groups, and each X is a pseudohalide selected from selenocyanate and isoselenocyanate.

2. The method of claim 1, wherein the silicon-containing film comprises SiO and the reagent comprises one or more of oxygen gas, ozone, water, alcohols, peroxide or plasmas thereof.

3. The method of claim 1, wherein the silicon-containing film comprises SiN and the reagent comprises one or more of amines, alkylamines, hydrazine, alkylhydrazines, allylhydrazines and plasmas thereof.

4. The method of claim 3, wherein the reagent further comprises a plasma of He, $NH_3$, $N_2$, Ar, $H_2$ or a combination thereof.

5. The method of claim 1, wherein the silicon-containing film comprises SiCON and the reagent comprises one or more of alcohols, peroxide, amines, alkyl amines, hydrazine, alkylhydrazines, allylhydrazines and plasmas thereof.

6. The method of claim 5, wherein the reagent further comprises a plasma of CO, $O_2$, $N_2O$, He, $NH_3$, $N_2$, Ar, $H_2$ or a combination thereof.

7. The method of claim 1, wherein the silicon-containing film comprises carbon.

8. The method of claim 7, wherein n is not 4.

9. The method of claim 7, wherein the reagent comprises one or more of alcohols, water, peroxide, amines, alkyl amines, hydrazine, alkylhydrazines, allylhydrazines and plasmas thereof.

10. The method of claim 9, wherein the reagent further comprises a plasma of CO, $O_2$, $N_2O$, He, $NH_3$, $N_2$, Ar, $H_2$ or a combination thereof.

11. A method of depositing a SiO-containing film, the method comprising exposing a substrate to a silyl pseudohalide and an oxidizing agent to deposit the SiN-containing film, wherein the silyl pseudohalide has a general formula of $R_{4-n}SiX_n$, wherein n is 1-4, each R is independently selected from H, alkyl, alkenyl, aryl, amino, alkyl amino, alkoxide, and phosphine groups, and each X is a pseudohalide selected from selenocyanate and isoselenocyanate.

12. The method of claim 11, wherein n is not 4.

13. The method of claim 11, wherein the oxidizing agent comprises one or more of oxygen gas, ozone, water, alcohols, peroxide or plasmas thereof.

14. The method of claim 11, A method of depositing a SiN-containing film, the method comprising exposing a substrate to a silyl pseudohalide and a nitridating agent to deposit the SiN-containing film, wherein the silyl pseudohalide has a general formula of $R_{4-n}SiX_n$, wherein n is 1-4, each R is independently selected from H, alkyl, alkenyl, aryl, amino, alkyl amino, alkoxide, and phosphine groups, and each X is a pseudohalide selected from selenocyanate and isoselenocyanate.

15. The method of claim 14, wherein n is not 4.

16. The method of claim 14, wherein the nitridating agent comprises one or more of amines, alkylamines, hydrazine, alkylhydrazines, allylhydrazines and plasmas thereof.

17. The method of claim 16, wherein the nitridating agent further comprises a plasma of He, $NH_3$, $N_2$, Ar, $H_2$ or a combination thereof.

* * * * *